United States Patent [19]

Tsuda et al.

[11] Patent Number: 4,825,175

[45] Date of Patent: Apr. 25, 1989

[54] BROADBAND, HIGH ISOLATION RADIAL LINE POWER DIVIDER/COMBINER

[75] Inventors: George I. Tsuda; James S. Ajioka, both of Fullerton, Calif.

[73] Assignee: Hughes Aircraft Company, Los Angeles, Calif.

[21] Appl. No.: 91,312

[22] Filed: Aug. 31, 1987

Related U.S. Application Data

[63] Continuation of Ser. No. 783,592, Oct. 3, 1985, abandoned.

[51] Int. Cl.[4] .......................... H03F 3/60; H03H 7/48

[52] U.S. Cl. .................................... 330/286; 330/287; 330/295; 333/125; 333/136; 333/21 A; 333/1.1

[58] Field of Search ................. 330/286, 287, 295, 53, 330/56; 333/125, 127, 136, 21 A, 1.1

[56] References Cited

U.S. PATENT DOCUMENTS

| | | | |
|---|---|---|---|
| 2,284,405 | 5/1942 | McArthur | 330/56 X |
| 3,182,326 | 5/1965 | Cutler | 342/356 |
| 3,284,717 | 11/1966 | Damiano et al. | 333/1.1 X |
| 3,290,682 | 12/1966 | Ajioka | 343/368 |
| 3,324,418 | 6/1967 | Caswell | 333/1.1 |
| 3,339,158 | 8/1967 | Passaro | 333/1.1 |
| 3,402,361 | 9/1968 | Havens | 330/56 X |
| 4,091,334 | 5/1978 | Sechi | 333/125 X |
| 4,175,257 | 11/1979 | Smith et al. | 330/287 |
| 4,189,683 | 2/1980 | Fassett et al. | 330/287 |
| 4,193,047 | 3/1980 | Carter et al. | 333/17 L |
| 4,234,854 | 11/1980 | Schellenberg | 330/286 |
| 4,238,747 | 12/1980 | Harp et al. | 333/228 |
| 4,263,568 | 4/1981 | Nemit | 333/127 |
| 4,371,845 | 2/1983 | Pitzalis | 333/127 X |
| 4,590,446 | 5/1986 | Hsu et al. | 333/125 |
| 4,641,106 | 2/1987 | Belohoubek et al. | 330/286 |
| 4,641,107 | 2/1987 | Kalokitis | 330/286 |
| 4,700,145 | 10/1987 | Yelland et al. | 330/286 |

FOREIGN PATENT DOCUMENTS

| | | | |
|---|---|---|---|
| 0122084 | 3/1983 | European Pat. Off. . | |
| 0123997 | 4/1983 | European Pat. Off. . | |
| 879231 | 2/1943 | France . | |
| 2229335 | 12/1974 | France | 333/1.1 |
| 887572 | 1/1962 | United Kingdom . | |

OTHER PUBLICATIONS

J. S. Ajioka, H. A. Uyeda, "Experimental Performance of a Multimode Radial Transmission Line Beam Forming Network", The Microwave Journal, Dec., 1968, pp. 53-58.

J. S. Ajioka, "A Multiple Beam-Forming Network Using a Multimode Radial Transmission Line", Nerem Record, Tuesday, Nov. 5, 1963, pp. 54-55.

B. J. Sanders, "Radial Combiner Runs Circles Around Hybrids", Microwaves, Nov., 1980, pp. 55-58.

*Primary Examiner*—Eugene R. LaRoche
*Assistant Examiner*—Benny T. Lee
*Attorney, Agent, or Firm*—Thomas A. Runk; Anthony W. Karambelas

[57] ABSTRACT

Disclosed is a power divider/combiner using two parallel plate radial transmission lines having parallel plate spacing of less than λ/2 and which operates in a higher order mode, preferably the first higher order circumferential mode $TE_{11}$. High isolation between amplifiers coupled to the radial transmission lines at their circumferences is achieved by coupling an arrangement of circulators between the amplifiers and the radial transmission lines. This isolation arrangement reduces the effects of any spurious signals that are generated by means such as imperfections and imbalances in any active devices coupled to the radial line and permits de-energizing amplifiers as desired for lowering power output without degrading performance.

15 Claims, 4 Drawing Sheets

BROADBAND, HIGH ISOLATION RADIAL LINE POWER DIVIDER/COMBINER

The Government has rights in this invention pursuant to contract F19628-83-C-0102 awarded by the Department of the Air Force.

This application is a continuation of application Ser. No. 783,592, filed Oct. 3, 1985, abondoned.

BACKGROUND OF THE INVENTION

The invention relates generally to parallel plate, radial lines and more particularly, to radial lines having high isolation.

Conventional power divider/combiners use branching transmission line networks that start from a single input port and branch out to N output ports (where N is the number of such ports) and vice versa for a combiner. Such networks are commonly known as corporate feeds. A corporate feed that uses simple three port T-junctions at each branch point is known as a reactive feed. As is well known, a three port junction is not impedance matched looking into all ports, (see Montgomery, Purcell and Dicke, MIT Rad. Lab. Series Vol. 8, *Principles of Microwave Circuits,* Chapter 9), hence, spurious reflections from any source such as at any other junction, connectors, bends etc. within the corporate feed or from any device at any of the outputs can cause large errors in the output amplitudes and phases and can cause resonances within the feed network. As a result, they can cause undesirable mutual coupling between the output devices, such as amplifiers, to result in spurious reflections or oscillations with a loss of efficiency and in some cases, high power breakdown. If each simple three port T-junction were replaced by a matched four port hybrid such as a magic-T or quadrature hybrid, these problems would be greatly alleviated because the spurious reflections are absorbed in the matched loads in the fourth port of the hybrid junction (see R. C. Johnson and H. Jasik, *Antenna Engineering Handbook,* Second Edition, pp. 20-55 through 20-56 and pg. 40-18).

A corporate feed using the above-described hybrid arrangement is typically quite complex, large, and costly because it contains on the order of N-1 hybrids, N-1 terminating loads, 2(N-1) bends and interconnecting transmission lines. It is also relatively lossy because, for cost purposes, the corporate feed is usually designed in stripline or microstrip which are very lossy compared to waveguide. As the number of power divisions increases, waveguide also becomes a relatively lossy technique. Also, stripline and microstrip have not been able to handle high peak or high average powers.

The radial line power combiner is used for combining the outputs of a plurality of circumferentially mounted power sources in a single combining structure. Likewise, it is usable for dividing an input signal into a plurality of output signals in a single structure. By using two radial lines, one functioning as a power divider and the other as a power combiner, a high power transmitter may be formed by coupling a plurality of individual power amplifying devices to the circumferences of both radial lines. However, in prior radial line techniques, the failure of an amplifier or amplifiers or the mismatching of a part of the radial line caused the generation of higher order modes with a resulting decrease in radial line efficiency and power output. Amplifiers such as injection locked impact avalanche and transit time (IMPATT) diodes are extremely sensitive to mismatches.

A prior technique used to suppress higher order modes in a radial line involves mounting resistors at the circumference of the radial line between the power sources. This technique is difficult to implement at the higher frequencies such as millimeter wave where the resistor size is small, thus making it difficult to handle. Also the use of a discrete resistor may limit the power handling capabilty of the radial line. It has been found that the isolation obtained by such an arrangement was generally not adequate for such sensitive amplifiers as injection locked IMPATT diodes.

Accordingly, it is an object of the invention to provide a radial line power divider/combiner which has the advantages of a radial line and which suppresses undesirable modes to a greater extent.

It is also an object of the invention to provide a radial line power divider/combiner which is able to handle relatively large power levels more efficiently.

SUMMARY OF THE INVENTION

The above objects and other objects are attained by the invention wherein there is provided a parallel plate, radial line power divider/combiner having a pair of radial transmission lines, a means for launching circularly polarized energy through a centrally located port in one radial transmission line, a centrally located means for coupling out combined power from the second radial transmission line, a plurality of power sources disposed about the circumferences of the radial transmission lines, and circulatorsccoupled between the circumferences of the radial transmission lines and the power sources. Where required, a transformer, such as an annular groove, is used to impedance match the cylindrical waves of the radial transmission line to the devices coupled at the circumference. If coaxial lines are used as the circumferential output ports of the radial transmission line, the annular groove transformer is not necessary since impedance matching can be achieved with proper spacing of the coaxial probes into the radial transmission line and proper positioning from the shorting cylinder that short circuits the parallel plates (see U.S. Pat. No. 3,290,682, J. S. Ajioka, "A Multiple Beam Antenna Apparatus," December 1966).

In accordance with the invention, a circularly polarized $TE_{11}$ mode is used which results in a higher order mode in the radial transmission line. In the radial transmission line functioning as a power divider, an input waveguide feed centrally located in one of the parallel plates is used to launch circularly polarized $TE_{11}$ ($|m|=1$) mode ($m=+1$ for a left hand circularly polarized wave and $m=-1$ for a right hand circularly polarized wave) in a circular waveguide which, in turn, launches the $m=\pm1$ mode in the radial transmission line.

At selected points around the circumference of the radial transmission line, the divided energy is coupled to a matched, non-reciprocal, three port circulator means which has one port coupled to a load device. The output of the circulator means is coupled to a second matched, non-reciprocal, three port circulator means, which couples the divided energy to a reflection type amplifier device. The amplified energy from the amplifier device is coupled into the same port of the second circulator. That circulator couples the amplified energy to a third matched non-reciprocal, three port circulator means which has one port coupled to a load device.

From that circulator means, the energy is coupled into the second radial transmission line at its circumference. This second radial transmission line functions as a power combiner. The circulators coupled to the radial transmission lines include 90° twist sections in the coupling arms.

In the radial line functioning as a power combiner in accordance with the invention, power inputs from the various positions on the circumference of the radial line are combined at a waveguide centrally located in one of the parallel plates which couples the combined energy out as circular polarized energy. The energy can be converted to linear polarized energy by the addition of a circular polarizer and orthomode transducer to the output feed.

A radial line power divider/combiner is a travelinq wave combiner. The mathematical form for cylindrical modes in the radial line is $e^{\pm jm\phi}\ H_m(1)(2)(kr)$ where $e^{\pm jm\phi}$ indicates the circumferential phase progression and $H_m^{(2)}(kr)$ defines the outward radiating waves and $H_m^{(1)}(kr)$ defines the incoming waves (where H is the Hankel function, k is $2\pi/\lambda$ and r is the radial distance from the center). In accordance with the invention, it utilizes a higher order circumferential mode, preferably the first higher order mode ($|m|=1$).

By using the combination of loaded circulator devices at the circumferences of the radial transmission lines, there is virtually no interaction between amplifiers. Certain power reflections occuring in the radial transmission lines will be absorbed by the loads on the circulator arms. Amplifiers may be turned off if a lower power output from the divider/combiner is desired, and if amplifiers fail, the divider/combiner can operate in a degraded mode.

Thus, the invention provides a relatively low cost, low loss, high power, and compact power divider/combiner. The circulator devices make it the electrical equivalent of a conventional corporate feed power divider/combiner in which a four port hybrid such as a magic tee is used at each branch point in the corporate feed.

BRIEF DESCRIPTION OF THE DRAWINGS

The various features and advantages of the invention together with further features, advantages and objects thereof are described with more precision in the following detailed description taken in conjunction with the accompanying drawings, in which.

DETAILED DESCRIPTION OF THE INVENTION

Figure 1:
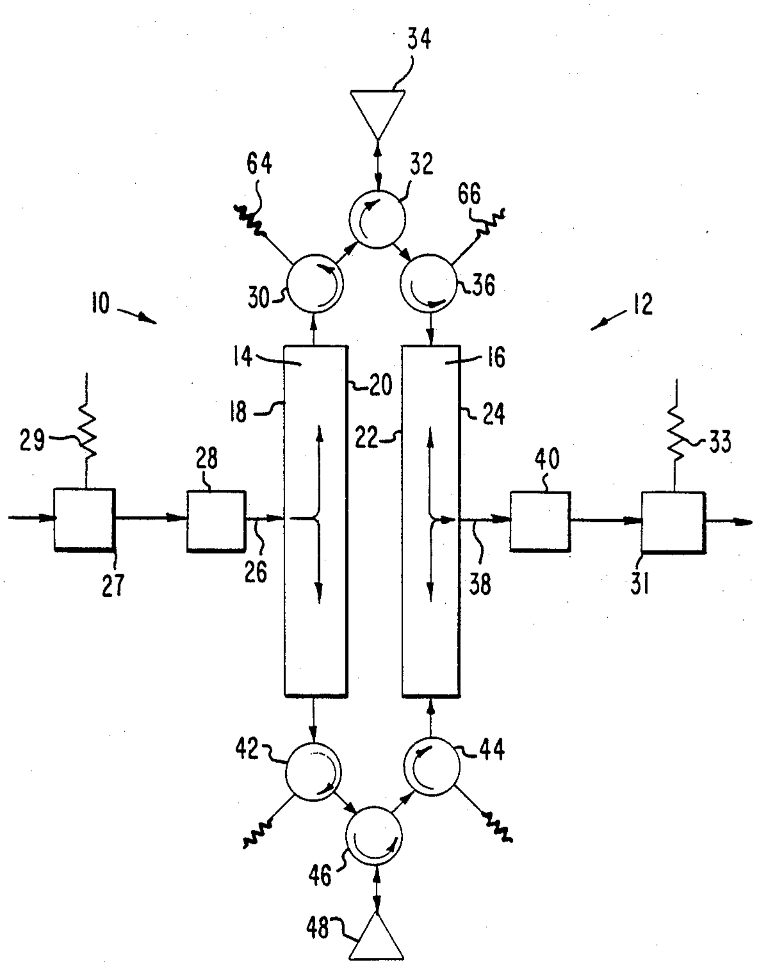
FIG. 1 is a schematic, block diagram of a broadband high isolation radial line power divider/combiner in accordance with the invention showing two radial transmission lines, circulators coupling amplifiers to the radial transmission lines at their circumferences in two places, and feeding arrangements for the radial transmission lines.

Referring now to the drawings wherein like reference numerals designate like or corresponding elements among the several views, there is shown in FIG. 1 a block diagram representation of a pair of $m=1$ mode radial line power divider/combiners 10 and 12 in accordance with the invention. The left radial line 10 functions as a power divider in this embodiment and includes a radial transmission line 14 for dividing applied energy. The right radial line 12 functions as a power combiner and includes a radial transmission line 16 for combining amplified energy in this embodiment. Each radial transmission line 14, 16 has two parallel plates (18 and 20; 22 and 24 respectively). Each pair of plates are preferably spaced at less than one-half of the wavelength of the applied energy. Circularly polarized, time varying $TE_{11}$ energy is launched into the power divider radial transmission line 14 by a suitable means such as by a waveguide feed 26, shown graphically as an arrow, an orthomode transducer 27, and a circular polarizer 28. The energy is divided by the radial transmission line 14 and there is a $2\pi$ progressive phase variation around the circumference of the radial transmission line 14. At one point on the circumference, a first circulator means 30 couples the energy out of the radial transmission line 14 and into a second circulator means 32. Reflections from between the circular polarizer 28 and the circulator 30 are absorbed in the load 29 of the orthomode transducer 27. The second circulator means 32 couples the energy to an amplifier 34 such as a reflection type amplifier which amplifies the energy and couples it back into the second circulator means 32 through the same port as it received the energy. The second circulator means 32 couples the amplified energy to a third circulator means 36 which couples the amplified energy to the power combiner radial transmission line 16. Some of the amplified energy, however, may leak back from the second circulator means 32 to the first circulator means 30. The load 64 of that circulator means 30 will absorb the leakage. (Load device 66 performs a similar energy absorption function for energy entering circulator 36 from the radial transmission line 16.) This radial transmission line 16 combines the amplified power with other power inputs from its circumference at a centrally located waveguide feed 38 shown graphically as an arrow. The circularly polarized, amplified power coupled by the waveguide feed 38 can be coupled directly, for example, to an antenna, or can be linearly polarized by a circular polarizer 40 and coupled out of a port of the orthomode transducer 31. The other port of the transducer 31 is coupled to a load 33.

In accordance with the invention, the first circulator means 30 is disposed between the radial transmission line 14 and the second circulator means 32 which is coupled directly to the amplifier 34. Without the first circulator means 30, the energy from the radial transmission line 14 would only go through the second circulator means 32 to the amplifier 34. Amplified energy will be directed to the third circulator means 36 from the amplifier 34, however, some may be leaked back through the second circulator means 32. If there is no first circulator means 30, this leaked energy will result in an unfavorable return loss to the input port of the radial transmission line 14. In some cases, this return loss will be too large for stable amplifier performance. As an example, where the amplifier 34 has 10 dB of amplification, and the second circulator means 32 isolation is 15 to 20 dB, there will be an approximate return loss of 5 to 10 dB to the input port. However, adding the first circulator means 30 results in a return loss of 20 to 30 dB.

Figure 2:
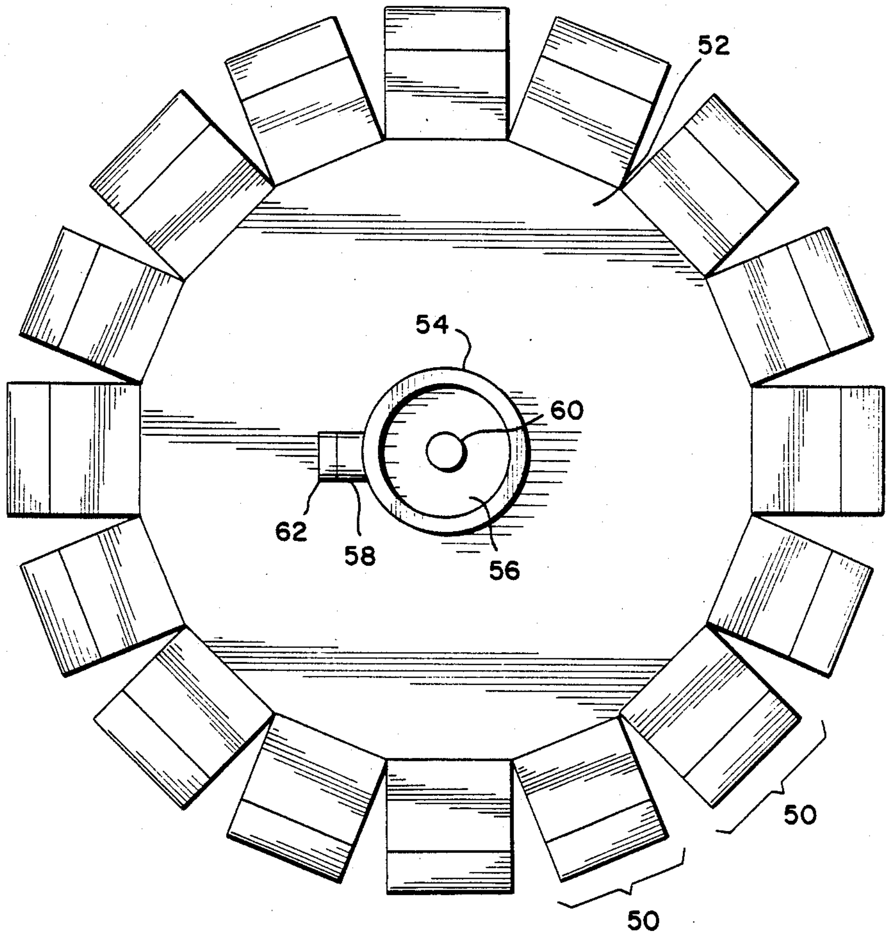
FIG. 2 is a top view of a radial line power divider/-combiner in accordance with the invention showing a plurality of amplifiers and circulator means disposed around the circumference of a radial transmission line. Also shown is a circular waveguide feed, an orthogonal port of that feed, and a matching device mounted on a parallel plate of the radial transmission line.

The above discussion refers to only one set of three circulator means and an amplifier disposed at one position on the circumference of the radial lines 14, 16 and is referred to as a "power module." Also shown is a second power module having three circulator means 42, 44, and 46, and amplifier 48 which operates the same as the first set, except at a different position on the circumferences of the radial transmission lines 14 and 16. One of the advantages of a radial line is that numerous power modules may be located about its circumference. If more power modules are needed, the circumference of the radial line is increased. As shown in FIG. 2, sixteen power modules (two of which are indicated by the numeral 50) are located about the radial transmission line 52. If more power modules 50 are required, the radial line 52 may be enlarged so that its circumference is increased to accommodate more as required. FIG. 2 also shows a feed 54 connected to the radial transmission line 52. The feed 54 comprises an orthomode transducer having a port of one polarization 56 and a port of orthogonal polarization 58. Also shown is a matching device 60 centrally located in relation to the feed 54 of the radial transmission line 52. The device 60 shown is conical in shape, however, other shapes are usable. Also shown is a load device 62 coupled to the orthogonal polarization port 58 of the orthomode transducer. Circularly polarized energy of the opposite sense from that desired in the radial transmission line 52 will be absorbed by this load device 62 thus increasing the isolation.

In certain prior techniques where less power is desired, a smaller power divider/combiner having fewer power modules would be used. One characteristic of the invention is the relatively high isolation obtainable between the amplifiers coupled to the radial transmission lines and to the input and output ports. Thus, in the invention if less power were required, the same number of power modules may be retained; however, some may simply be turned off without having a substantial adverse effect on the remaining, functioning amplifiers.

Three port circulators 30, 32, and 36 are shown in FIG. 1 and these may be the well-known symmetrical junction (Y junction) of three waveguides together with an axially magnetized ferrite rod or disk placed at the center of the junction. The circulators 30 and 36 coupled directly to the radial transmission lines 14, 16 have one of the three ports loaded with an energy absorbing device. As shown, the loaded port is the port to which reflections or spurious energy entering the circulator from the opposite direction would be conducted. Thus, the circulator 30 connected to the power divider radial transmission line 14 will conduct energy from that line 14 to the second circulator 32; however, energy entering the first circulator 30 from the direction of the second circulator 32, such as by reflection, will be coupled to the load device 64 and be absorbed thereby isolating the radial transmission line 14.

A similar operation occurs with the third circulator 36 which is connected to the power combiner radial transmission 16 at its circumference. The third circulator 36 will conduct energy entering it from the second circulator 32 directly to the radial transmission line 16. However, energy entering the third circulator 36 from the radial transmission line (due to reasons such as unbalances in phase/amplitude or reflections from amplifiers) will be conducted to the load device 66 where it will be absorbed. This third circulator 36 provides very high isolation from the radial transmission line 16 back to the amplifier 34. As shown in FIG. 1, energy not absorbed by this load device 66 will be conducted to the second circulator 32. Since the second circulator 32 is also unidirectional, it will conduct energy received from the third circulator 36 to the first circulator 30 which will conduct that energy unidirectionally to the load device 64.

Thus, a high isolation power divider/combiner is formed within which spurious energy is dissipated by circulator means with associated load devices.

Figure 3A:
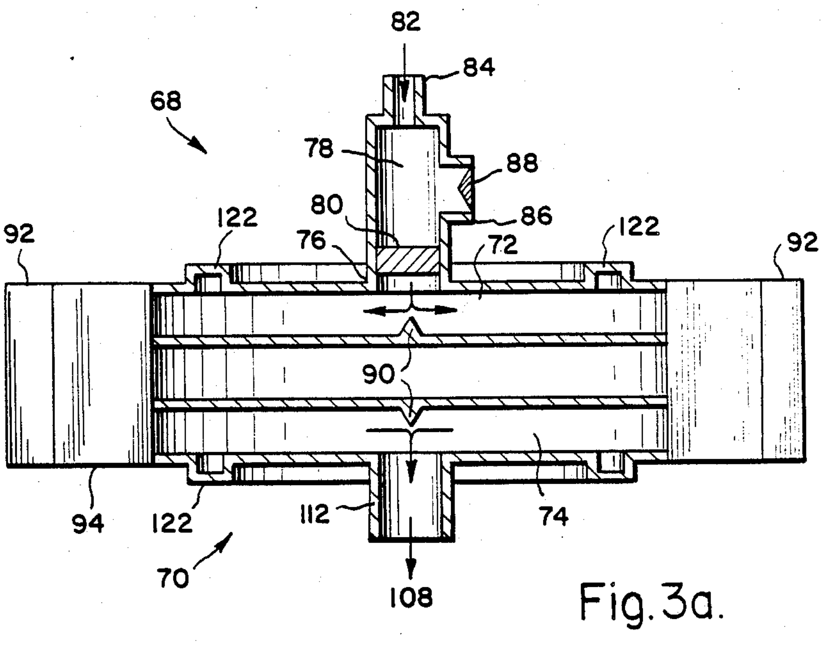
FIG. 3*a* is a schematic, block diagram of a cross-sectional side view of a radial line power divider/combiner in accordance with the invention showing two parallel plate radial transmission lines each with circular waveguide feeds centrally located in one of the circular parallel plates of each, the divider radial transmission line feed having a circular polarizer and an orthomode transducer with one port of the transducer loaded with a power absorbing device, and also showing circulator means and amplifiers located at the circumferences of the radial transmission lines.

Another view of an embodiment of the invention is shown in FIG. 3*a* wherein a compact power divider/combiner is disclosed. In this view, there are two radial lines 68 and 70 each having a radial transmission line 72, 74, respectively. The upper radial line 68 functions as a power divider and the lower radial line 70 functions as a power combiner. As in FIG. 1, circularly polarized energy is launched into the power divider radial transmission line 72 by a waveguide 76 feed via an orthomode transducer 78 and a circular polarizer 80 (quarter-wave plate). A $TE_{11}$ mode is used and the input waveguide 76 is circular and is dimensioned to support that mode. Energy 82 introduced into one port 84 of the orthomode transducer 78 is circularly polarized by the quarter-wave plate circular polarizer 80, thus, the power divider radial transmission line 72 has a $2\pi$ phase variation around the radial transmission line. Energy introduced into the second port 86 of the orthomode transducer 78 which is orthogonal to the first port 84 would be polarized in the opposite sense by the circular polarizer 80 and the progressive phase will be opposite of the former case. As shown in FIG. 3*a*, the second port 86 of the orthomode transducer 78 is loaded with an energy absorbing device 88. Reflections or other spurious energy arriving at this port will be absorbed, thus increasing the isolation of the radial transmission line 72. A circular polarizer means usable in the invention may take the form of a quarter wave plate such as that shown or other types of circular polarizers known in the art.

As the relatively low power input energy 82 enters the power divider radial transmission line 72, it is divided equally around the radial transmission line 72 ($2\pi$ progressive phase variation) and is coupled to its circumference. In FIG. 3*a*, matching devices 90 for both radial transmission lines 72, 74 may take the form of a conical object as shown or other shape. Also, other types of matching devices such as a tuning "button" known in the art may be used.

In FIG. 3*a*, there are shown in block diagram form, two power modules each having an amplifier 92 and circulator means 94 coupled to the radial transmission lines 72 and 74 at their circumferences. The amplifiers 92 shown are of a reflective type. The circulator means in this embodiment comprise three circulators which are of the waveguide junction type. The circulator means has been modified for greater compactness by adding 90° twist sections 95 to one of the arms of each of two of the circulators 96, 98 as shown in FIG. 3*b*.

Figure 3B:
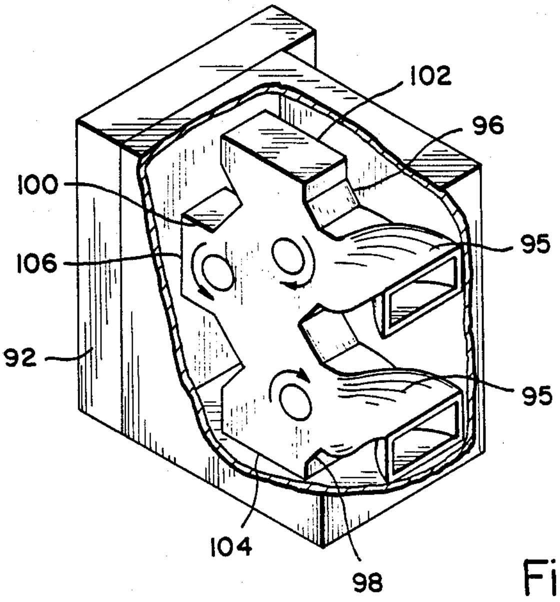
FIG. 3*b* is a diagrammatic view of a circulator arrangement in accordance with the invention where there are three circulators compactly located, two of which have 90° twists in one arm.

As shown in FIG. 3*b*, the circulators 96, 98, 100 used are the H-plane, waveguide junction type with a centrally located ferrite post. These are three port, matched, non-reciprocal type circulators, two of which 96, 98 have one arm 95 twisted by 90°, to couple to the respective radial transmission lines 72, 74. The feature of twisting one arm by 90° allows use of the H-plane circulators which may be coupled directly to the radial transmission lines 72, 74. Also, as shown in FIG. 3*b*, the two circulators 96, 98 with the 90° twists 95 each have one arm loaded with a power absorbing device 102, 104, respectively. These devices 102, 104 operate as the resistors 64, 66 shown schematically in FIG. 1 to absorb reflections and other spurious signals as discussed previously. Arrows are used to show the coupling direction in each of the three circulators. A signal from radial transmission line 72 would enter the twist section 95 of the first circulator means 96 and be coupled to the amplifier 92 via circulator means 100. The amplified signal would enter circulator 100 and be coupled to the radial transmission line 74 via circulator 98 with its 90° twist section 95.

As further shown in FIG. 3*b*, one port 106 of the center circulator 100 is coupled to the amplifier 92. In this embodiment, reflection type amplifiers are used, thus, the single circulator port 106 couples the low power energy into the amplifier 92 and couples the amplified energy out of the amplifier 92. The incident low power enters the amplifier 92 input/output port and the amplified high power leaves this same port; hence, it is equivalent to a reflection with a reflection coefficient greater than unity. Thus, only three port circulators are required. A reflection amplifier usable is an IMPATT diode type and a circulator with a 90° bend as shown is made by M/A - Com Millimeter Products, Inc., Burlington, Mass., 01803.

The power combined in the power combiner radial transmission line 74 which still maintains $2\pi$ progressive phase variation around the radial transmission line 74 is circularly polarized when it enters the output waveguide 112 feed. In the case where the radial line 70 is coupled to a feed system which is circularly polarized, linearly polarizing devices would not normally be connected with the output waveguide 112 feed. However, where linearly polarized energy is required, the configuration shown in FIG. 1 may be applied, i.e., a circular polarizer 40, such as a quarter wave plate, converts the circularly polarized energy back to linearly polarized energy. This circular polarizer 40 may be coupled to the output waveguide feed 112. The linearly polarized energy will appear at one of the ports of the orthomode transducer 31. Residual, undesired power that is polarized in the opposite sense will appear in the orthogonal port of the orthomode transducer 31 and can be absorbed by the terminating load 33. The output waveguide 112 feed is also dimensioned to support the desired mode, preferably the $TE_{11}$ mode. The term "feed" is used herein in a general sense and includes a means for conducting power to or from the radial line power divider/combiner.

Figure 4:
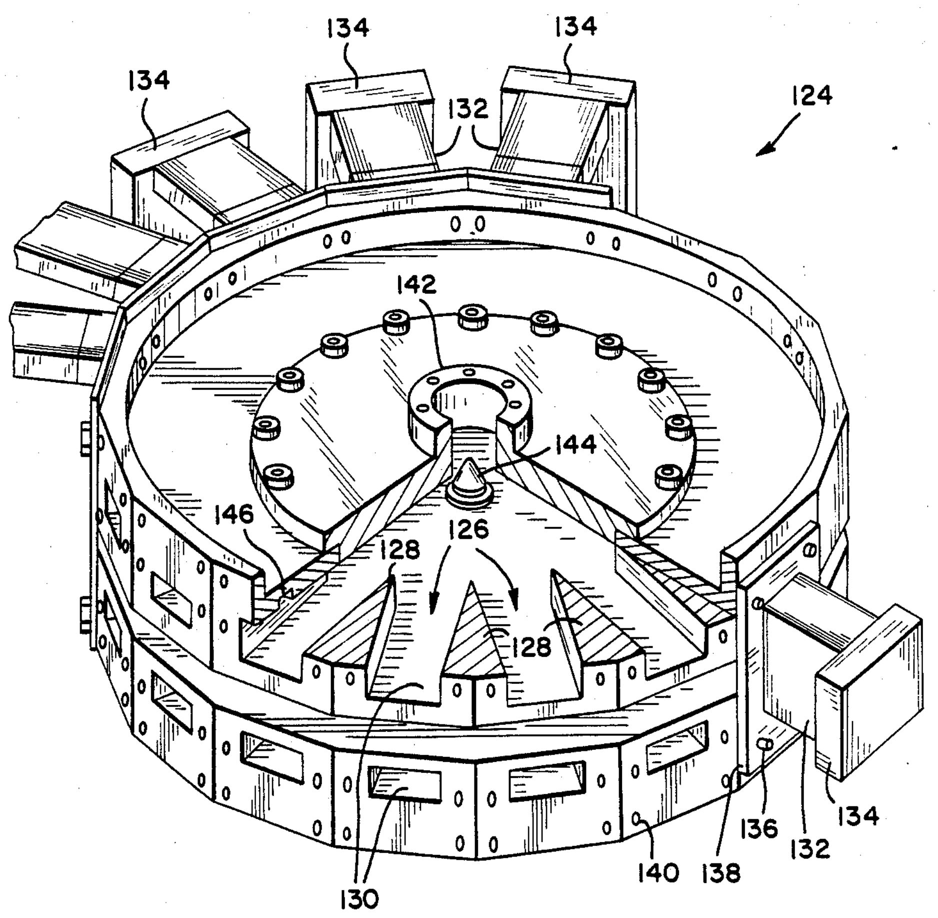
FIG. 4 is a partially cutaway perspective view of an embodiment of a radial line power divider/combiner in accordance with the invention having circulator means and amplifier devices coupled at the circumferences of two radial transmission lines to form a power amplifier.

In this embodiment shown in FIG. 3*a*, the power divider radial transmission line 72 is identical to the power combiner radial transmission line 74. Thus, a relatively low power input signal 82 is amplified and results in a relatively high power output signal 108 through the use of the two radial transision lines 72 and 74 used cooperatively with the circulators and the amplifiers coupled to their circumferences. Also shown in FIG. 3*a* are annular impedance matching grooves 122. These grooves 122 match the waves of the radial transmission lines 72, 74 to the waveguide sections 126 (FIG. 4). Such matching means may be of a different configuration or not be required such as where coaxial probes are used to couple the energy out to the circulators. Matching may then be accomplished by positioning the coaxial probes appropriately. In the embodiments shown, relatively high power application may be achieved since waveguide components are used. The radial transmission lines will support relatively high power levels, and circular waveguide is used for the feeds. This is a distinct advantage over power dividers/combiners using the TEM mode where coaxial feeds are used.

In FIG. 4 there is presented a perspective, partially cutaway view of an embodiment of the invention. A radial line power divider/combiner 124 is shown using two back-to-back parallel plate radial transmission lines. In FIG. 4, the two radial transmission lines have circumferential waveguides 126 formed by vanes 128 which are part of the structure. To the ports 130 formed by the waveguides 126 are attached twist circulator means 132 such as described previously. For clarity, most have been removed in FIG. 4 and those attached are shown in block form. To the circulator means 132 are attached amplifiers 134 also shown in block form. As shown, the circulator means 132 are attached to the circumferences of the radial transmission lines and the waveguides 126 by means of inserting screws 136 through the mounting flange 138 of the circulator means 132 and into screw holes 140. Also shown are a circular waveguide feed 142, a matching device 144, and a matching groove 146 disposed over a circumferential waveguide 126 of the radial transmission line.

Thus, there has been disclosed a new and improved radial line power divider/combiner. This radial line power divider/combiner has the advantages of radial transmission lines and due to the improvements of the invention, additionally suppresses undesired reflections and modes without degradation of its power handling capability.

Imbalances in phase and/or amplitude among the amplifiers (which are ideally identical) typically generate undesired modes in the radial line which, in prior techniques, can cause a large amount of coupling between the amplifiers which, in turn, can cause spurious oscillation and damage. A common situation is where an amplifier fails. This failure typically generates a large number of undesired modes which can lead to the catastrophic results explained above. With the invention, the isolation between amplifiers is greater, thus reducing the degrading effects of a failed amplifier. And, it has been found that in a radial line power divider/combiner in accordance with the invention, amplifiers may purposely be de-energized when less power output is desired without seriously degrading performance. This permits greater power control since larger circumference radial line devices may be used to accommodate a relatively large number of power modules for a relatively large power output and when less power is desired, one or more modules maybe deenergized. Thus, use of the invention results in a versatile power source. Also, mismatching effects from coupling the power divider/combiner to another device, such as to a subsequent antenna, will have a reduced impact on the power divider/combiner due to the high isolation obtained by use of the invention.

Although the invention has been described and illustrated in detail, this is by way of example only and is not meant to be taken by way of limitation. Modifications in design, structure, and arrangement may occur to those skilled in the art without departure from the scope of the invention.

What is claimed is:

1. A radial line power divider/combiner for processing applied energy and operating in a selected circumferential mode m, where |m| is a value of at least one, comprising:

a first radial transmission line having first and second parallel, circular, electrically conductive plates separated from each other by less than one-half of the wavelength of the applied energy, and an input feed port formed in one of the plates at a centrally located position and being dimensioned to support the selected mode m for receiving the applied energy;

feed means at the input feed port for circularly polarizing and launching the applied energy in the selected circumferential mode m into the first radial transmission line comprising a first $TE_{11}$ waveguide for applying the energy and a circular polarizer means for circularly polarizing the energy from the first waveguide;

a second radial transmission line having first and second parallel, circular, electrically conductive plates separated from each other by less than one-half of the wavelength of the applied energy, and an output feed port formed in one of the plates at a centrally located position and being dimensioned to support the selected mode m through which combined energy may be output;

a plurality of processor means for processing energy of the first radial transmission line;

a plurality of first coupling means for unidirectionally coupling energy out of said first radial transmission line at the circumference thereof, each of said plurality of first coupling means comprising first and second H-plane waveguide, three port circulators arranged such that the first circulator is coupled to the first radial transmission line and unidirectionally couples energy to the second circulator which is coupled to a corresponding one of the plurality of the processor means, the second circulator being arranged such that energy received from the first circulator is unidirectionally coupled to said processor means and processed energy received back from said processor means is coupled to the second circulator;

a plurality of second coupling means for unidirectionally coupling processed energy from the second circulators, each of said plurality of second coupling means comprising a third H-plane waveguide, three port circulator arranged such that it is coupled to a corresponding one of the first coupling means and unidirectionally couples processed energy received from the second circulator to the second radial transmission line at its circumference;

the circulators are oriented in relation to the radial transmission lines such that the H-plane of the circulators is substantially orthogonal to the H-plane of the radial transmission lines;

guiding means for providing a twist of 90° to the energy coupled from the first radial transmission line to the first circulator and to the energy coupled from the third circulator to the second radial transmission line;

first and second energy absorbing load devices respectively coupled to the first and third circulators, whereby spurious signals may be absorbed in the load devices; and feed means at the output feed port for receiving energy for the selected circumferential mode m in the second radial transmission line comprising a second $TE_{11}$ waveguide for outputting the combined energy.

2. A radial line power divider/combiner for processing applied energy and operating in a selected circumferential mode m, where |m| is a value of at least one, comprising:

a first radial transmission line having first and second parallel, circular, electrically conductive plates separated from each other by less than one-half of the wavelength of the applied energy, and an input feed port formed in one of the plates at a centrally located position and being dimensioned to support the selected mode m for receiving the applied energy;

feed means at the input feed port for circularly polarizing and launching the applied energy in the selected circumferential mode m into the first radial transmission line;

a second radial transmission line having first and second parallel, circular, electrically conductive plates separated from each other by less than one-half of the wavelength of the applied energy, and an output feed port formed in one of the plates at a centrally located position and being dimensioned to support the selected mode m through which combined energy may be output;

a plurality of processor means for processing energy of the first radial transmission line comprising a reflection amplifier;

a plurality of first coupling means for unidirectionally coupling energy out of said first radial transmission line at the circumference thereof, each of said plurality of first coupling means comprising first and second H-plane waveguide, three port circulators arranged such that the first circulator is coupled to the first radial transmission line and unidirectionally couples energy to the second circulator which is coupled to a corresponding one of the plurality of the processor means, the second circulator being arranged such that energy received from the first circulator is unidirectionally coupled to said processor means and processed energy received back from said processor means is coupled to the second circulator;

a plurality of second coupling means for unidirectionally coupling processed energy from the second circulators, each of said plurality of second coupling means comprising a third H-plane waveguide, three port circulator arranged such that it is coupled to a corresponding one of the first coupling means and unidirectionally couples processed energy received from the second circulator to the second radial transmission line at its circumference;

the circulators are oriented in relation to the radial transmission lines such that the H-plane of the circulators is substantially orthogonal to the H-plane of the radial transmission lines;

guiding means for providing a twist of 90° to the energy coupled from the first radial transmission line to the first circulator and to the energy coupled from the third circulator to the second radial transmission line;

first and second energy absorbing load devices respectively coupled to the first and third circulators, whereby spurious signals may be absorbed in the load devices; and feed means at the output feed port for receiving energy for the selected circumferential mode m in the second radial transmission line.

3. The radial line power divider/combiner of claim 2 wherein:

the first feed means comprises a first $TE_{11}$ waveguide coupled to the input feed port of the first radial transmission line for applying the energy, and further comprises a circular polarizer means for circularly polarizing energy conducted by the first waveguide; and the second feed means comprises a second $TE_{11}$ waveguide coupled to the output feed port of the second radial transmission line for outputting the combined energy.

4. The radial line power divider/combiner of claim 3 wherein the second feed means further comprises a linear polarizing means for linearly polarizing energy conducted by the second waveguide.

5. A radial line power divider/combiner for processing applied energy and operating in a selected circumferential mode m, where $|m|$ is a value of at least one, comprising:

a first radial transmission line having first and second parallel, circular, electrically conductive plates separated from each other by less than one-half of the wavelength of the applied energy, and an input feed port formed in one of the plates at a centrally located position and being dimensioned to support the selected mode m for receiving the applied energy;

a first $TE_{11}$ waveguide coupled to the input feed port of the first radial transmission line for launching the applied energy in the selected circumferential mode m;

a circular polarizer means for circularly polarizing energy conducted by the first waveguide;

a plurality of first coupling means comprising first and second H-plane waveguide, three port circulators arranged such that the first port of the first circulator is coupled to the first radial transmission line and receives energy therefrom, the first circulator unidirectionally couples said energy received at its first port to its second port, the second circulator being arranged such that the first port of the second circulator is coupled to the second port of the first circulator and receives energy therefrom, the second circulator unidirectionally couples said energy received at its first port to its second port;

a pair of amplifier means for receiving energy from corresponding ones of said first coupling means at the second port of the second circulator thereof, for amplifying the energy received, and for coupling said amplified energy back to the second port of said second circulator;

a second radial transmission line having first and second parallel, circular, electrically conductive plates separated from each other by less than one-half of the wavelength of the applied energy, an output feed port formed in one of the plates at a centrally located position and being dimensioned to support the selected mode m through which combined energy may be output;

a plurality of second coupling means for unidirectionally coupling amplified energy from said plurality of first coupling means to said second radial transmission line at the circumference thereof, each of said plurality of second coupling means comprising a third H-plane waveguide, three port circulator arranged such that its first port is coupled to the third port of the second circulator and receives energy therefom, and unidirectionally couples said received energy to the second radial transmission line at its circumference;

the first and third circulators each have the third port coupled to an energy-absorbing load device, whereby spurious signals may be absorbed in the load device;

the circulators are oriented in relation to the radial transmission lines such that the H-plane of the circulators is substantially orthogonal to the H-plane of the radial transmission lines;

further comprising guiding means for providing a twist of 90° to the energy coupled from the first radial transmission line to the first circulator and to the energy coupled from the third circulator to the second radial transmission line;

a second $T_{11}$ waveguide coupled to the output feed port of the second radial transmission line for receiving and outputting the combined energy of the selected circumferential mode m.

6. The radial line power divider/combiner of claim 5 further comprising linear polarizing means for linearly polarizing energy conducted by the second waveguide.

7. A radial line power divider/combiner for processing applied energy and operating in a selected circumferential mode m, where $|m|$ is a value of at least one, comprising:

a first radial transmission line comprising first and second parallel, circular, electrically conductive plates separated from each other by less than one-half of the wavelength of the applied energy, and an input feed port formed in one of the plates at a centrally located position and being dimensioned to support the selected mode m;

a first $TE_{11}$ waveguide coupled to the input feed port of the first radial transmission line for launching the applied energy in the selected circumferential mode m;

a circular polarizer means coupled to said first $TE_{11}$ waveguide for circularly polarizing energy conducted by the first waveguide;

amplifier means for amplifying the applied energy;

a second radial transmission line having first and second parallel, circular, electrically conductive plates separated from each other by less than one-half of the wavelength of the applied energy, an output feed port formed in one of the plates at a centrally located position and being dimensioned to support the selected mode m through which combined energy may be output;

a first H-plane, three port circulator having an first port coupled to the first radial transmission line at its circumference, and a second port coupled to an energy-absorbing load device;

a second H-plane, three port circulator having a first port coupled to the second radial transmission line at its circumference, and a second port coupled to an energy-absorbing load device;

a third H-plane, three port circulator having an inlet port coupled to an outlet port of the first circulator, having a second port coupled to the amplifier means, and having an outlet port coupled to an inlet port of the second circulator;

the first, second and third circulators being arranged such that the first circulator unidirectionally couples energy received at the circumference of the first radial transmission line to the third circulator, the third circulator unidirectionally couples energy received from the first circulator to the amplifier means and unidirectionally couples energy received back from the amplifier means to the second circulator, and the second circulator unidirectionally couples energy received from the third circulator to the circumference of the second radial transmission line;

the circulators are oriented in relation to the radial transmission lines such that the H-plane of the circulators is substantially orthogonal to the H-plane of the radial transmission lines;

the first and second circulators each comprise an arm disposed between the respective radial transmission line and the circulator within which is disposed the first port;

the arm of each of the first and second circulators is arranged such that it provides a 90° twist to the energy coupled between each circulator and its respective radial transmission line;

a second $TE_{11}$ waveguide coupled to the output feed port of the second radial transmission line for receiving and outputting the combined energy of the selected circumferential mode m; and linear polarizing means for linearly polarizing energy conducted by the second waveguide.

8. The radial line power divider/combiner of claim 7 further comprising a first orthomode transducer comprising three ports, two ports of which are orthogonal to each other and the third port being coupled to the first waveguide, the applied energy being input to one of the orthogonal ports, and a load device being coupled to the other of the orthogonal ports.

9. The radial line power divider/combiner of claim 8 further comprising a second orthomode transducer comprising three ports, two ports of which are orthogonal to each other and the third port being coupled to the second waveguide, the combined energy being output through one of the orthogonal ports, and a load device being coupled to the other of the orthogonal ports.

10. The radial line power divider/combiner of claim 7 wherein said arms comprise:

a first waveguide section disposed between and coupling the first radial transmission line to the first circulator; and a second waveguide section disposed between and coupling the second circulator to the second radial transmission line.

11. A radial line power divider/combiner for processing applied energy and operating in a selected circumferential mode m, where $|m|$ is a value of at least one, comprising:

a first generally circular, radial transmission line for dividing energy applied t a centrally-located input feed port of said first radial transmission line, said feed port being dimensioned to support the selected mode m;

first feed means for launching applied energy in the selected circumferential mode m into the first radial transmission line at said input feed port;

a second generally circular, radial transmission line for combining energy of the selected circumferential mode m at an output feed port formed at a centrally located position of said second radial transmission line, said output feed port being dimensioned to support the selected mode m, and to output combined energy therethrough;

processor means for processing the applied energy;

coupling means for unidirectionally coupling divided energy out of the first radial transmission line at the circumference thereof and into the processor means, and for unidirectionally coupling processed energy from the processor means into the second radial transmission line at the circumference thereof, said coupling means comprising first, second and third H-plane waveguide, three port circulators, the first circulator being coupled to the first radial transmission line at its circumference for coupling energy received thereat to the processing means, the second circulator being coupled to the second radial transmission line at its circumference for coupling the processed energy from the processing means to the second radial transmission line at its circumference, and the third circulator having an inlet port coupled to an outlet port of the first circulator, an outlet port coupled to an inlet port of the second circulator and a third port coupled to said processing means, the third circulator being arranged such that energy received from the first circulator is unidirectionally coupled to the processing means, and processed energy received back from the processing means is unidirectionally coupled to the said second circulator; and the circulators are oriented in relation to the radial transmission lines such that the H-plane of the circulators is substantially orthogonal to the H-plane of the radial transmission lines; and second feed means for receiving combined energy of the selected circumferential mode m from the output feed port of said second radial transmission line.

12. The radial line power divider/combiner of claim 11 wherein said first and second circulators include guiding means for providing a twist of 90° to the energy coupled from the first radial transmission line to the first circulator and to the energy coupled from the second circulator to the second radial transmission line.

13. A radial line power divider/combiner for processing applied energy and operating in a selected circumferential mode m, where $|m|$ is a value of at least one, comprising:

a first radial transmission line;

a second radial transmission line;

a plurality of processor means for processing said applied energy; and a plurality of coupling means for unidirectionally coupling divided energy out of said first radial transmission line at its circumference and into one of said processor means, and for unidirectionally coupling processed energy from said processor means into said second radial transmission line at its circumference, said coupling means comprising first, second and third H-plane waveguide, three port circulators, the first circulator being coupled to the first radial transmission line at its circumference for coupling energy received thereat to the processing means, the second circulator being coupled to the second radial transmission line at its circumference for coupling the processed energy from the processing means to the second radial transmission line at its circumference, and the third circulator having an inlet port coupled to an outlet port of the first circulator, an outlet port coupled to an inlet port of the second circulator and a third port coupled to said processing means, the third circulator being arranged such that energy received from the first circulator is unidirectionally coupled to the processing means, and processed energy received back from the processing means is unidirectionally coupled to the second circulator with each of said coupling means being joined to separate processor means in said plurality of processor means; and the circulators are oriented in relation to the radial transmission lines such that the H-plane of the circulators is substantially orthogonal to the H-plane of the radial transmission lines.

14. The radial line power divider/combiner of claim 13 wherein said first and second circulators include guiding means for providing a twist of 90° to the energy coupled from the first radial transmission line to the first circulator and to the energy coupled from the second circulator to the second radial transmission line.

15. The radial line power divider/combiner of claim 13 wherein each of the processor means is a reflection-type amplifier.

* * * * *